United States Patent
Li et al.

(10) Patent No.: US 12,181,543 B2
(45) Date of Patent: Dec. 31, 2024

(54) RECEIVING SURFACE COIL FOR NUCLEAR MAGNETIC RESONANCE MEASUREMENTS

(71) Applicant: KONINKLIJKE PHILIPS N.V., Eindhoven (NL)

(72) Inventors: Yuan Ping Li, Suzhou (CN); Deyi Qiu, Suzhou (CN); Biao Xie, Suzhou (CN); Yu Zhao, Suzhou (CN); Bing Wu, Suzhou (CN)

(73) Assignee: Koninklijke Philips N.V., Eindhoven (NL)

( * ) Notice: Subject to any disclaimer, the term of this patent is extended or adjusted under 35 U.S.C. 154(b) by 124 days.

(21) Appl. No.: 17/918,201

(22) PCT Filed: Apr. 12, 2021

(86) PCT No.: PCT/EP2021/059364
§ 371 (c)(1),
(2) Date: Oct. 11, 2022

(87) PCT Pub. No.: WO2021/213820
PCT Pub. Date: Oct. 28, 2021

(65) Prior Publication Data
US 2023/0141671 A1    May 11, 2023

(30) Foreign Application Priority Data

Apr. 20, 2020    (WO) ................ PCT/CN2020/085533
May 14, 2020    (EP) ..................................... 20174586

(51) Int. Cl.
*G01R 33/34*    (2006.01)
*G01R 33/36*    (2006.01)

(52) U.S. Cl.
CPC ..... *G01R 33/34084* (2013.01); *G01R 33/365* (2013.01)

(58) Field of Classification Search
CPC ............ G01R 33/34084; G01R 33/365; G01R 33/3415
See application file for complete search history.

(56) References Cited

U.S. PATENT DOCUMENTS

| 5,500,596 A | 3/1996 | Grist et al. |
| 6,169,400 B1 | 1/2001 | Sakuma |

(Continued)

FOREIGN PATENT DOCUMENTS

| WO | 2007046014 A2 | 4/2007 |
| WO | 2014150161 A1 | 9/2014 |
| WO | 2018111334 A1 | 6/2018 |

OTHER PUBLICATIONS

International Search Report and Written Opinion from PCT/EP2021/059364 mailed Jun. 11, 2021.

*Primary Examiner* — Alexei Bykhovski

(57) ABSTRACT

For a receiving surface coil for detecting nuclear magnetic resonance signals from a patient, a solution for an easy adaptation of the receiving surface coil to the anatomy of the patient is disclosed. This is achieved by a receiving surface coil for detecting nuclear magnetic resonance signals from a patient, the receiving surface coil comprising: a flexible housing with an opening, a set of RF loop elements housed in the flexible housing, wherein the set of RF loops comprises at least a central loop element running around the opening in the flexible housing and a number of loop elements arranged around the opening.

19 Claims, 4 Drawing Sheets

(56) References Cited

U.S. PATENT DOCUMENTS

| | | |
|---|---|---|
| 6,750,653 B1 | 6/2004 | Zou et al. |
| 7,382,132 B1 | 6/2008 | Mathew et al. |
| 2008/0136412 A1 | 6/2008 | Kato |
| 2011/0166437 A1 | 7/2011 | Chang et al. |
| 2011/0241683 A1 | 10/2011 | Nnewihe et al. |
| 2013/0190607 A1 | 7/2013 | Biber et al. |
| 2015/0309131 A1 | 10/2015 | Rehner |
| 2016/0363641 A1* | 12/2016 | Finnerty .......... G01R 33/34007 |
| 2017/0067973 A1 | 3/2017 | Hyun et al. |
| 2018/0263561 A1* | 9/2018 | Jones ............... G01R 33/34007 |
| 2019/0383891 A1* | 12/2019 | Iwasawa ............ G01R 33/3642 |

* cited by examiner

RECEIVING SURFACE COIL FOR NUCLEAR MAGNETIC RESONANCE MEASUREMENTS

CROSS REFERENCE TO RELATED APPLICATIONS

This application is a U.S. national phase application of International Application No. PCT/EP2021/059364 filed Apr. 12, 2021, which claims the benefit of PCT/CN2020/085533 filed Apr. 20, 2020 and EP Application Serial No. 20174586.6 filed on May 14, 2020, all of which are incorporated herein by reference.

FIELD OF THE INVENTION

The invention relates to the field of receiving surface coils for detecting nuclear magnetic resonance signals from a patient.

BACKGROUND OF THE INVENTION

Magnetic Resonance Imaging (MRI) is a medical imaging technique used in radiology to image the anatomy and the physiological processes of a subject of interest. MRI uses a magnet to create a strong, uniform, static magnetic field (i.e., the "main magnetic field") and gradient coils to produce smaller amplitude, spatially varying magnetic fields when a current is applied to the gradient coils. When a subject of interest is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis and the gradient coils encode the MR signal.

RF coils are used to create pulses of RF energy at or near the resonance frequency of the hydrogen nuclei, also referred to herein as the Larmor frequency. These RF coils are used to transmit RF excitation signals and receive responses and detect MR signals used to form the images. In MR tomography with a magnetic resonance tomography device (MR or MRT), images with a high signal to noise ratio (SNR) may be recorded using receiving surface coils. Receiving surface coils are antenna systems positioned in direct proximity on (anterior) or below (posterior) the patient. During an MR measurement, excited nuclei in the individual antennas of the local coil induce a Voltage that is amplified using a low-noise preamplifier (e.g., LNA, preamp) and forwarded by cable to an electronic receive system. To improve the signal to noise ratio even with high-resolution images, high-field systems are used (e.g., 1.5 T to 12 T and more).

Surface coils are small and are shaped so that they can be placed near the part of anatomy being imaged. By their nature, surface coils have good signal-to-noise ratio for the tissue adjacent to the coil. They also allow for smaller voxel size which in turn allows for improved image resolution. However, the sensitivity decreases greatly as the distance from the coil is increased. US2016363641A1 discloses an MRI coil for use during an interventional procedure. The MRI coil includes a central portion for accommodating an opening which provides access for an interventional tool. A single loop element running around the opening is at least partially positioned within the central portion. The MRI coil further includes two wings extending away from the central portion and additional loop elements positioned on opposite sides of the single loop element are at least partially positioned within the outer wings. US2011166437A1 discloses a surface coil used during thermal ablation procedure. The surface coil defines a belt shape with a belt hole. The surface coil bends to wrap all the way around a body trunk and the belt-like surface coil further rotates to place the belt hole on the target tissue of thermal ablation. WO2014150161A discloses a pelvic coil assembly that comprises a curved portion with an aperture defined therein and a waist-line portion extending upward and laterally from the front of the curved portion. US20170067973A discloses a coil assembly capable of being easily repaired. The coil assembly includes a PCB substrate contained in a bendable case.

However, conventional receiving surface coils tend to be bulky, rigid and are configured to be maintained at a fixed position relative to other RF coils in an array. This bulkiness and lack of flexibility often prevents the RF coil loops from coupling most efficiently with the desired anatomy and make them very uncomfortable for the imaging subject e.g. a patient.

The conventional geometry of a receiving surface coil is approximately a rectangle, but the anatomy it used to image usually differs in size and shape, such as elbow, foot ankle, knee joint and breast, etc. Using the conventional coil with regular geometry, it is difficult to be close to anatomy as much as possible and will influence the image quality in a scan.

SUMMARY OF THE INVENTION

It is an object of the invention to provide a receiving surface coil for detecting nuclear magnetic resonance signals from a patient which can be better and more easily adapted to the anatomy of the patient to achieve a higher resolution of a MR measurement.

According to the invention, this object is addressed by the subject matter of the present disclosure. Preferred embodiments of the invention are described below.

Therefore, according to the invention, a receiving surface coil for detecting nuclear magnetic resonance signals from a patient is provided, the receiving surface coil comprising: a flexible housing with an opening, a set of RF loop elements housed in the flexible housing, wherein the set of RF loop elements comprises at least a central loop element running around the opening in the flexible housing and a plurality of loop elements arranged around the opening. Advantageously, the opening can fit the protrusion of the anatomy of a patient, such as joint and breast, to have the coil more closely placed over the anatomy. The receiving surface coil is further bendable at least along two directions of the receiving surface coil owing to the newly designed geometry, to form a one-piece, bendable structure around the opening. Moreover, the coil loop layout increases central image quality since most of the loop elements make contributions to the central area.

In an embodiment of the invention, the receiving surface coil comprises at least one groove along a surface of the flexible housing of the receiving surface coil. The advantage is that the grooves guide the bending to help determine the deformation and resulting shape of the receiving surface coil.

According to another embodiment of the invention, the at least one groove along the surface of the flexible housing of the receiving surface coil is located on an inner side of the receiving surface coil, said inner side being adapted to be placed over a patient's site to be examined.

According to an embodiment of the invention, the receiving surface coil comprises a central part and at least two parts laterally adjoining the central part extending from the central part in opposite directions, such that the receiving surface coil has an elongated extension along the longitudinal axis of the receiving surface coil, wherein the opening is located in the central part.

According to an embodiment of the invention the parts extending from the central part are subdivided by n grooves into a number of n+1 segments, where n=1, 2, 3, ..., which are joined to one another. The advantage that the parts extending from the central part are divided into segments by the grooves is that the receiving surface coil can be bent along these grooves.

In another embodiment of the invention, the grooves in the parts extending from the central part run perpendicular to the longitudinal axis of the receiving surface coil. This allows the parts extending from the central part to be easily wrapped around an object to be examined.

In an embodiment of the invention, the receiving surface coil comprises at least two grooves in the central part wherein the grooves are so arranged to cross each other in the opening of the central part. This has the advantage that the receiving surface coil can better fit around a part to be examined, which improves the reception of nuclear magnetic resonance signals.

According to another embodiment, the set of RF loop elements comprises a plurality of loop elements which are arranged around the opening in the central part, wherein the plurality of loop elements overlap at least with the central loop element.

According to another embodiment, the set of RF loop elements comprises at least seven loop elements, the central loop element running around the opening in the central part and at least six further loop elements arranged around the opening in the central part, wherein every two loop elements overlap.

According to another embodiment of the invention, the receiving surface coil comprising further electrical elements within the flexible housing, wherein the further electrical elements are arranged in the flexible housing in a region where the flexible housing does not comprise grooves. This has the advantage that with such a placement of the electrical elements, the electrical elements undergo only a slight bending and are protected from a force added by bending of the receiving surface coil. In another embodiment of the invention, the further electrical elements are detuning circuits and/or feed boards.

In another embodiment of the invention, the flexible housing comprises a flexible foam.

According to another embodiment of the invention, the flexible foam is mechanically flexible. A mechanically flexible foam provides good protection of the electrical elements inside the flexible housing. In addition, the foam is more comfortable for the patient if the coil is placed directly on the patient's skin.

In a further aspect of the invention, the object is achieved by a magnetic resonance imaging system comprising a receiving surface coil for detecting nuclear magnetic resonance signals from a patient as described above.

BRIEF DESCRIPTION OF THE DRAWINGS

These and other aspects of the invention will be apparent from and elucidated with reference to the embodiments described hereinafter. Such embodiments do not necessarily represent the full scope of the invention, however, and reference is made therefore to the present disclosure herein for interpreting the scope of the invention.

In the drawings:

FIGS. 4a and 4b shows the distribution of loop elements within the receiving surface coil according to two embodiments of the invention, FIGS. 5a and 5b schematically depicts a receiving surface coil, wherein

DETAILED DESCRIPTION OF EMBODIMENTS

Figure 1:
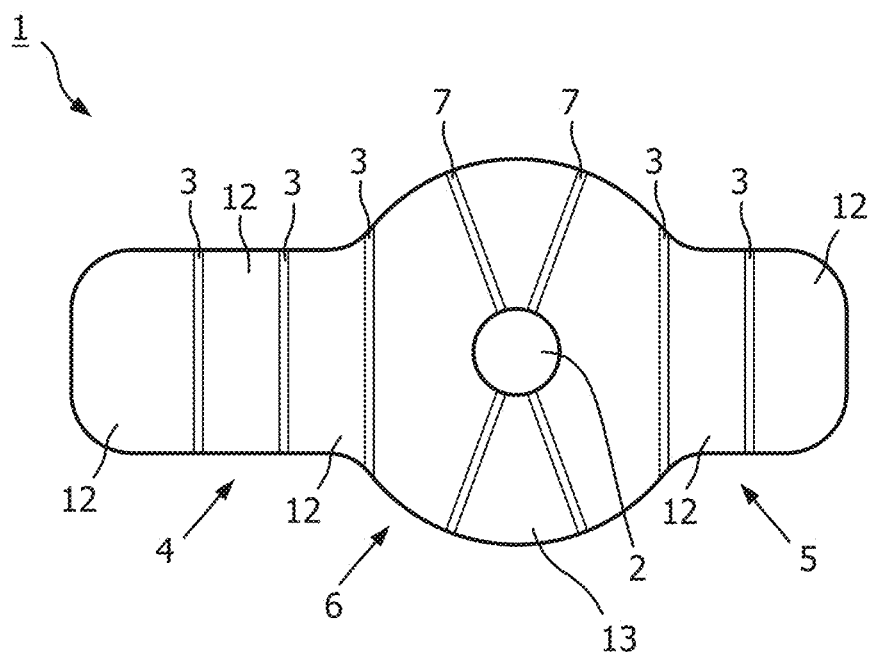
FIG. 1 schematically depicts a receiving surface coil for detecting nuclear magnetic resonance signals from a patient according to a first embodiment of the invention, FIG. 2 schematically depicts the receiving surface coil from the first embodiment, wherein the coil is bended along some grooves.

FIG. 1 schematically depicts a receiving surface coil 1 for detecting nuclear magnetic resonance signals from a patient according to a first embodiment of the invention. The receiving surface coil 1 described below can be e.g. a Flex M coil. The coil 1 comprises an outer surface and an inner surface, wherein the inner surface is placed over the patient for detecting the nuclear magnetic resonance signals from the patient. In an embodiment of the invention the receiving surface coil 1 comprises a flexible housing 13 with an opening 2 and a set of RF loop elements 8, 9 (shown in FIGS. 4a and 4b) with at least a central loop element 9 running around the opening 2 and a plurality of other loop elements 8 centered around the opening 2. The flexible housing 13 can be round with the previously described arrangement of the loop elements 8, 9 in an embodiment of the invention.

The receiving surface coil 1 shown in FIG. 1 covers in an embodiment of the invention three parts 4, 5, 6. A central part 6 which, in a version of the invention, may have a round shape and at least two parts 4, 5 laterally adjoining the central part 6 extending from the central part 6 in opposite directions, such that the receiving surface coil 1 has an elongated extension along the longitudinal axis of the receiving surface coil 1. Thus, a larger coverage of the receiving surface coil 1 and a larger SNR can be achieved. In the embodiment of FIG. 1, a width of the at least two parts 4, 5 is less than the width of the central part 6, such that the at least two parts 4, 5 define opposite flaps of the central part 6. Narrower flaps facilitate the bending of the central part 6 around the opening 2 to form a shape that conforms to the patient anatomy. Furthermore, additional loop elements 8 can be placed in the lateral parts 4, 5.

The central part 6 of the coil 1 includes an opening 2, which can have a round shape as shown in FIG. 1. However, other shapes of the opening 2 are also conceivable. For example, the opening 2 can have a star shape in another embodiment. The opening 2 ensures that the coil 1 can be placed as close as possible to the object to be examined, for example a knee or breast. The opening 2 also helps in positioning the coil 1, as it makes it easier to find the center of the coil 1.

The two parts 4, 5 laterally adjoining the central part 6 can be same length or for example can show different lengths. In FIG. 1 it is further shown that the two parts 4, 5 are interrupted by vertical grooves 3 that divide the two parts 4, 5 into individual segments 12. The grooves 3 form hinges that make it easier to bend the coil 1.

The central part 6 can also have several grooves 7. FIG. 1 shows an example where the grooves 7 run along the surface of the coil 1 in an X-shape and are arranged to intersect in the center of the opening 2 when each groove is elongated along a longitudinal axis of the groove. This makes it easier to bend the coil 1, especially in the central part 6 of the coil 1 and adapt it to the corresponding anatomy of a patient, for example. In addition to X-shaped grooves 7, however, a grid of grooves or a honeycomb structure of grooves can also be provided, for example, to facilitate bending of the coil 1. In one embodiment, the grooves 7 form many indentations along an inner surface of the coil 1. When the coil 1 is bent, the indentations on the inner surface are closed. The depth of the indentations is determined to ensure an easy bending but no intersection with the PCB board housed within the coil 1. Alternatively, both inner surface and outer surface of the coil 1 can be provided with the grooves 7 to realize a reversible coil, both sides of which can be placed over the patient anatomy to further facilitate the positioning.

The receiving surface coil 1 can be covered with a flexible foam in one version. It may be intended that the grooves 3, 7 run in the flexible foam to further facilitate bending of the coil 1.

Figure 2:
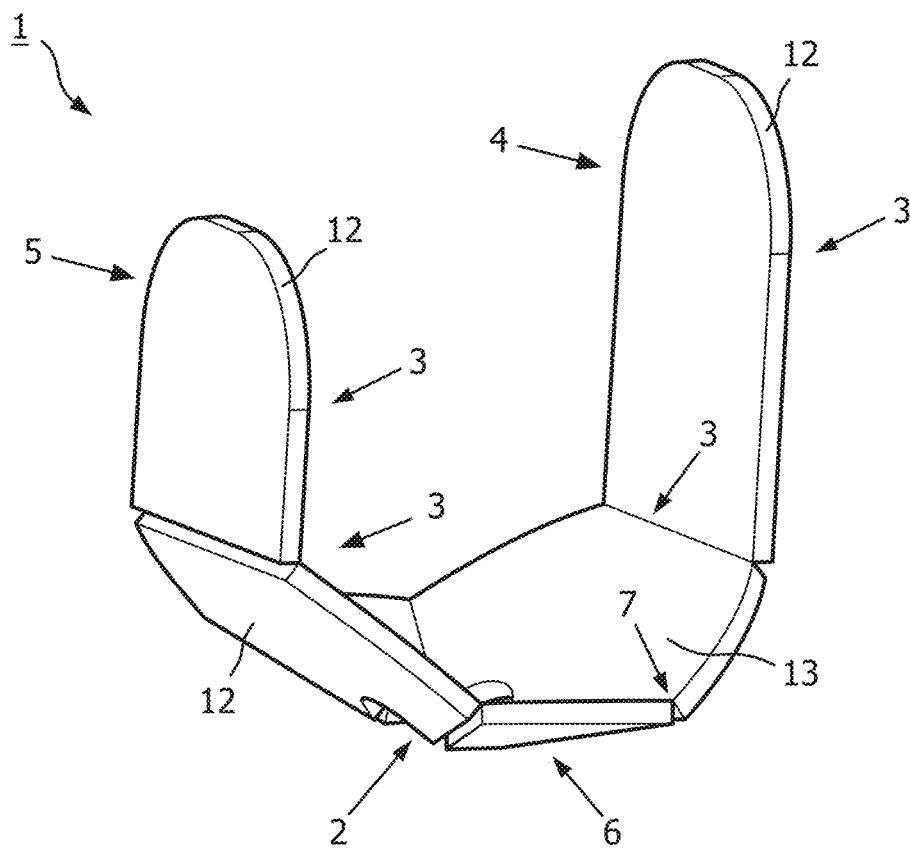

FIG. 2 schematically depicts the receiving surface coil 1 from the first embodiment, wherein the coil 1 is bent along some grooves 3, 7. In FIG. 2 it can be seen, that the coil 1 can be easily bent around the opening 2 of the central part 6 due to the X-shaped grooves 7. This allows the coil 1 to be easily adapted to the corresponding anatomy of the patient. The lateral parts 4, 5 of the coil 1 can, for example, be placed around the part of the patient's body that is to be examined in order to further improve the resolution of the coil 1.

Figure 3:
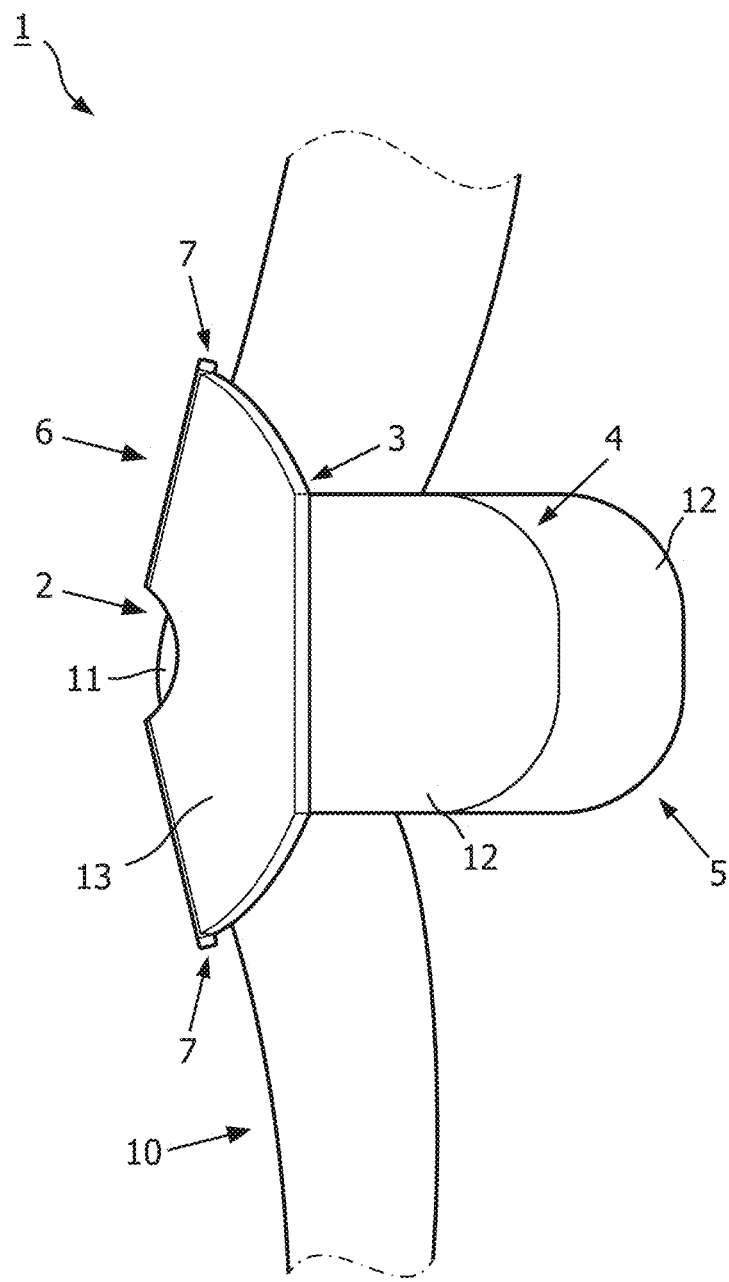
FIG. 3 shows exemplarily the application of the receiving surface coil on a human elbow.

FIG. 3 shows exemplarily the application of the receiving surface coil 1 on a human elbow 11. In FIG. 3 a patient's arm 10 with the coil 1 placed around the patient's arm 10 at elbow level is shown. The elbow 11 can be exactly in the opening 2 of the coil 1, for example. The opening 2, the grooves 3, 7 and the flexible structure of the coil 1 allows the coil 1 to be easily placed around the patient's arm 10, thus increasing the image quality.

Figure 4A:
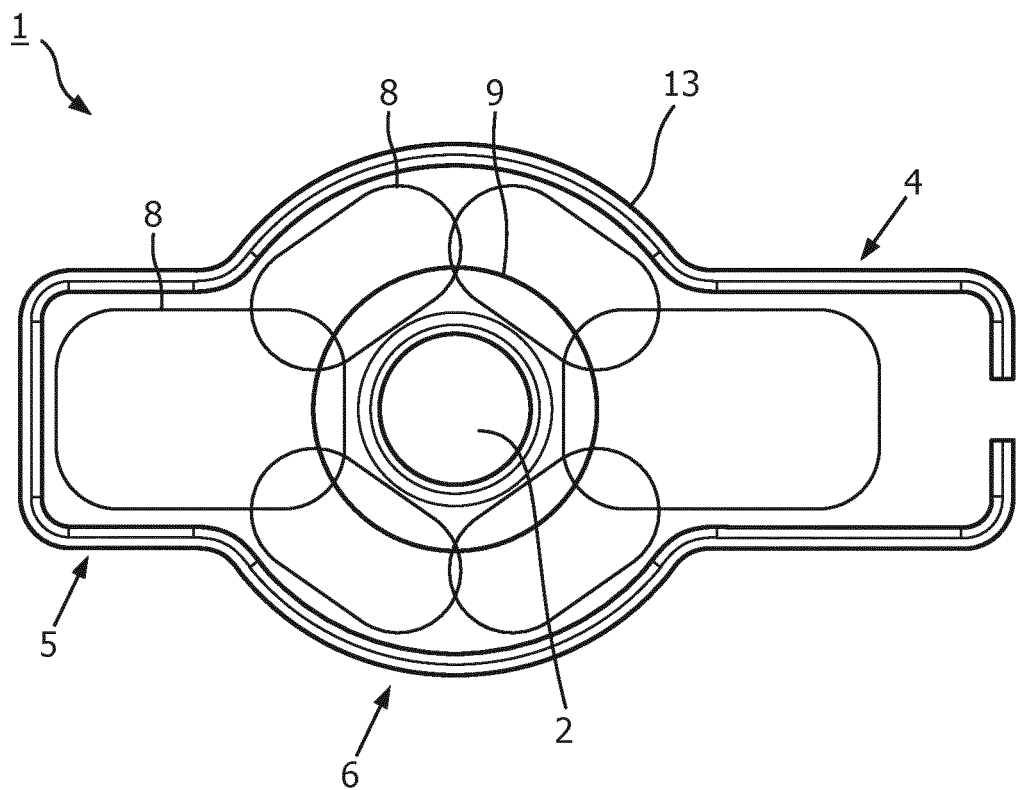
Figure 4B:
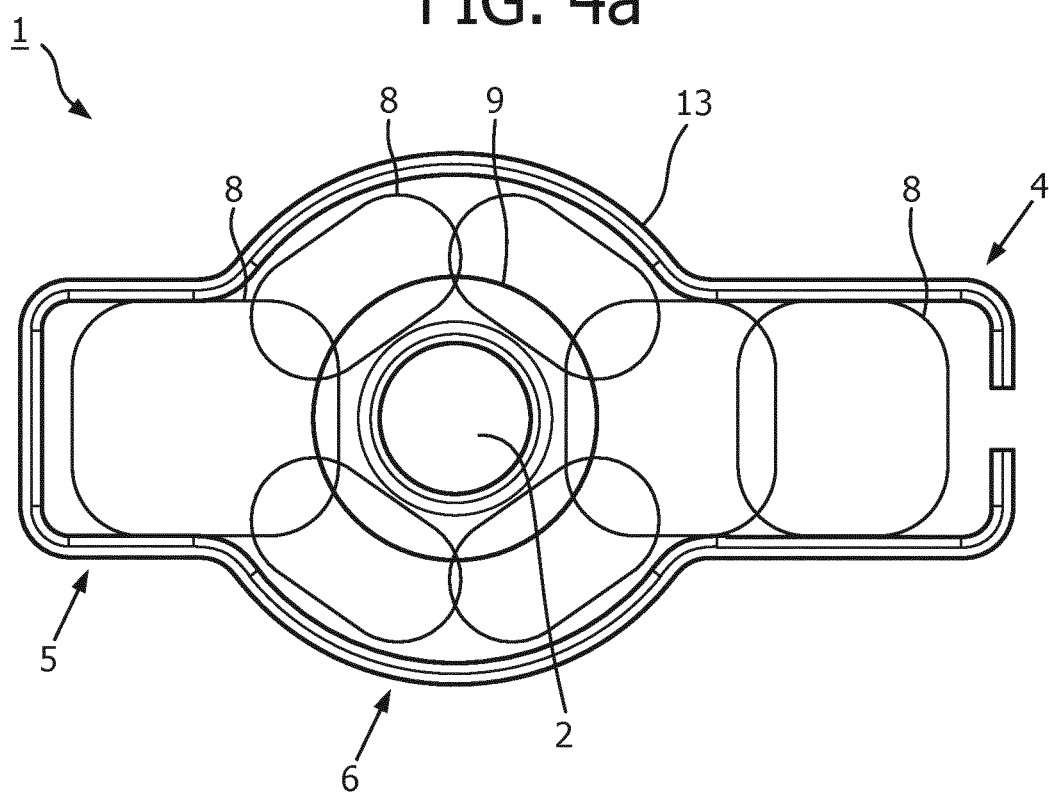

FIGS. 4a and 4b show the distribution of loop elements 8, 9 within the receiving surface coil 1 according to two embodiments of the invention. A receiving surface coil 1 mainly includes a set of RF loop elements 8, 9, detuning circuits, feed boards and cables. The set of RF loop elements 8, 9 detuning circuits and feed boards are located on a printed circuit board (PCB).

The loop elements 8, 9 resonate at a specific center frequency of MRI system. The detuning circuits are used to switch the coil 1 into tune or detune status. The cables route RF signals and control signals. The feed boards mainly include the independence match circuits for pre-amplifiers and direct current circuits for the coil 1. In an embodiment the pre-amplifiers are not placed on the coil PCB board, to make the coil lighter and more flexible. In an embodiment of the invention the detuning circuits, feed boards and/or other electrical elements are arranged in the flexible housing 13 in a region where the flexible housing 13 does not comprise grooves 3, whereby the detuning circuits, feed boards and/or other electrical elements undergo only a slight bending and are protected from a force added by bending of the receiving surface coil 1. The set of RF loop elements 8, 9 of the receiving surface coil 1 shown in FIGS. 4a and 4b comprises in an embodiment of the invention seven or eight loop elements 8, 9. In FIG. 4a an embodiment of the invention with seven loop elements 8, 9 is shown. An approximate circular shaped loop element 9 is in the middle of the central part 6, with six loop elements 8 around. Every two loop elements 8 overlap to decouple, and most of the loop elements 8 contribute to the central part 6 as these loop elements 8 are arranged around and adjacent to the opening 2, which can improve the image quality in the central scan region. The receiving surface coil 1 in the embodiment with seven loop elements 8, 9 has a symmetrical shape and is e.g. good for dual coil usage. With the opening in other shapes, the loop elements 8 are arranged around and adjacent to the opening, resulting in a shape approximately following a curvature of the opening.

In FIG. 4b a receiving surface coil 1 with eight loop elements 8, 9 is shown. An approximate circular shaped loop element 9 is in the middle of the central part 6, with six loop elements 8 around. Also, with this embodiment every two loop elements 8 overlap to decouple, and most of the loop elements 8 contribute to the central part 6, which can also improve the image quality in the central scan region. In addition, the receiving surface coil 1 has an eighth loop element 8, which is also located in one of the parts 4, 5 laterally adjoining the central part 6. By simply combining two of these coils 1, high-resolution imaging such as NVA anterior, breast screening and knee scanning can be provided.

Figure 5A:
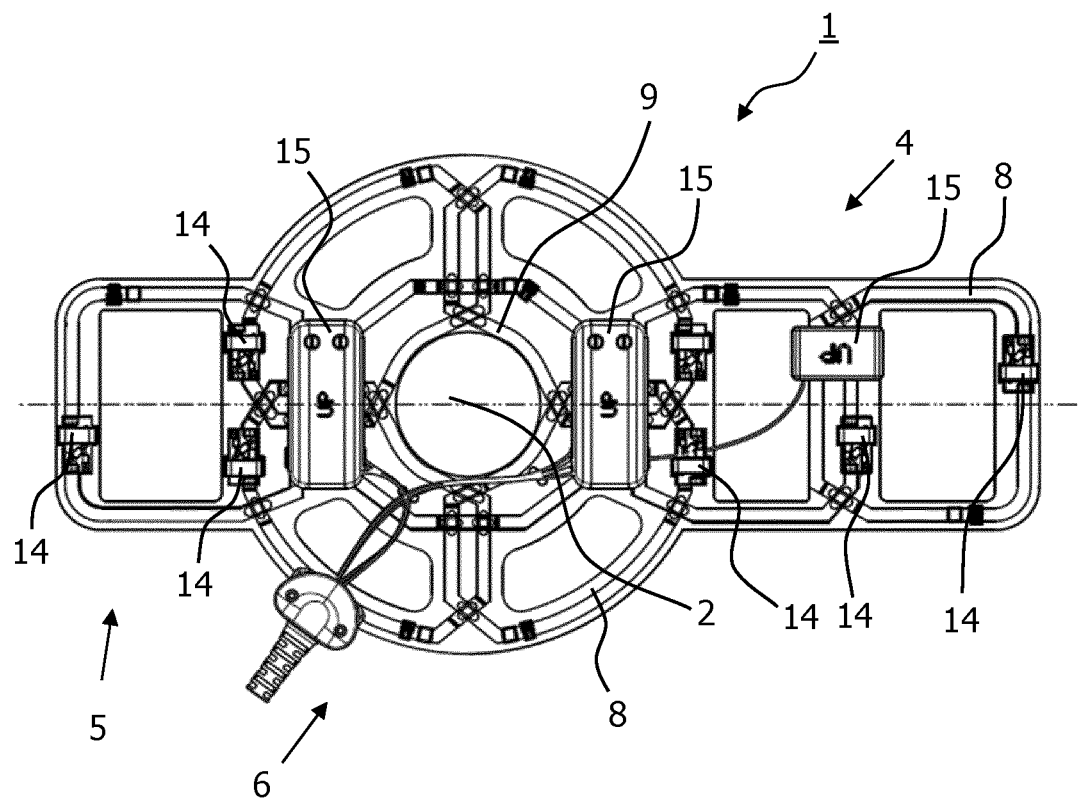
FIG. 5a depicts the distribution of electrical elements within the flexible housing of the receiving surface coil according to an embodiment of the invention and FIG. 5b depicts the distribution of grooves on the flexible housing of the receiving surface coil according to an embodiment of the invention.
Figure 5B:
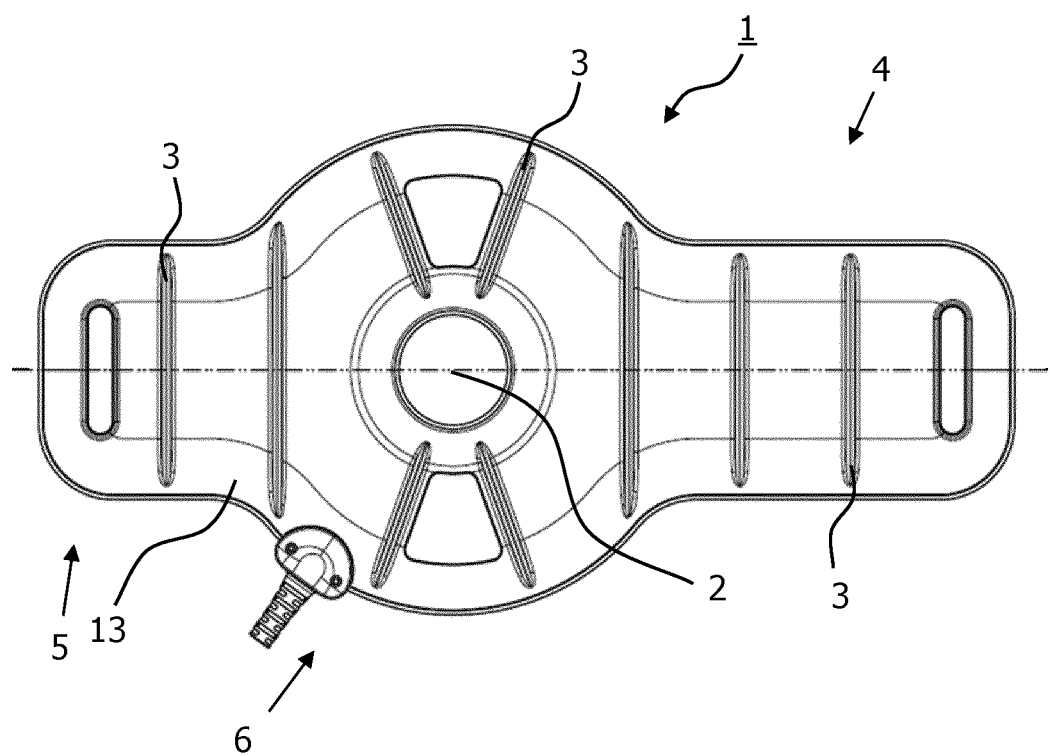

In FIG. 5a the distribution of further electrical elements 14, 15 within the flexible housing 13 of the receiving surface coil 1 according to an embodiment of the invention is shown. Especially the distribution of the loop elements 8, the central loop element 9, the detuning circuit 14 and the feed boards 15 can be seen. If one compares the distribution of the electrical elements 14, 15 shown in FIG. 5a with the distribution of the grooves 3 in the flexible housing 13 of the receiving surface coil 1 shown in FIG. 5b, it becomes apparent that, in particular in one embodiment of the invention, the detuning circuit 14 and the feed boards 15 are arranged in an area within the flexible housing 13 which does not comprise grooves 3. This means that the electrical elements 14, 15 are only slightly bent, as the bend is essentially along the grooves 3 and are therefore protected from a force added by bending of the receiving surface coil 1.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST receiving surface coil 1
opening 2 groove 3
first part 4
second part 5
central part 6
X-shaped grooves 7
loop element 8
central loop element 9
human arm 10
human elbow 11
segment 12
flexible housing 13
detuning circuit 14
feed board 15

The invention claimed is:

1. A receiving surface coil for detecting nuclear magnetic resonance signals from a patient, the receiving surface coil comprising:
    a housing having a central part and at least two parts extending from the central part in opposite directions, wherein an opening is defined in the central part of the housing and the central part is configured to bend in a hinged structure around the opening to form a shape that conforms to a patient anatomy in the form of a protrusion to be examined, wherein the receiving surface coil comprises at least two grooves in the central part, wherein the at least two grooves are arranged such that the lines they define cross each other in the opening of the central part;
    a set of RF loop elements housed in the central part of the housing, wherein the set of RF loop elements comprises at least a central loop element and more than two other loop elements which are arranged to increase central image quality with the central loop element running around the opening and the more than two other loop elements arranged around and adjacent to the opening.

2. The receiving surface coil according to claim 1, wherein the receiving surface coil comprises a plurality of grooves in the at least two parts along a surface of the housing of the receiving surface coil and configured to guide a bending of the receiving surface coil.

3. The receiving surface coil according to claim 1, wherein the opening is configured to receive at least part of the protrusion of the patient anatomy.

4. The receiving surface coil according to claim 1, wherein a width of the at least two parts is less than a width of the central part, such that the at least two parts define opposite flaps adjoining the central part.

5. The receiving surface coil according to claim 1, wherein the at least two parts extending from the central part are subdivided by n grooves into a number of n+1 segments where n=1, 2, 3, . . . , which are joined to one another.

6. The receiving surface coil according to claim 2, wherein the grooves in the at least two parts extending from the central part run perpendicular to the longitudinal axis of the receiving surface coil.

7. The receiving surface coil according to claim 1, wherein the more than two other loop elements are arranged in an approximately circular array around the opening, wherein the more than two other loop elements arranged around the opening overlap at least with the central loop element.

8. The receiving surface coil according to claim 7, wherein the set of RF loop elements comprises at least seven loop elements, the central loop element running around the opening in the central part and at least six further loop elements arranged around the opening in the central part, wherein every adjacent two of the six further loop elements overlap.

9. The receiving surface coil according to claim 2, comprising further electrical elements within the housing, wherein the further electrical elements are arranged in the housing in a region where the housing does not comprise grooves.

10. The receiving surface coil according to claim 9, wherein the further electrical elements are detuning circuit and/or feeding board.

11. The receiving surface coil according to claim 1, wherein the housing comprises a foam.

12. The receiving surface coil according to claim 11, wherein the foam is mechanically flexible.

13. The receiving surface coil according to claim 1, wherein the opening is located at a center of the central part.

14. A magnetic resonance imaging system comprising the receiving surface coil for detecting nuclear magnetic resonance signals from a patient according to claim 1.

15. A receiving surface coil for detecting nuclear magnetic resonance signals from a patient, the receiving surface coil comprising:
    a housing having a central part and at least two parts extending from the central part in opposite directions, wherein an opening is defined in the central part of the housing, wherein the receiving surface coil comprises at least two grooves in the central part, wherein the at least two grooves in the central part are arranged such that the lines they define cross each other in the opening of the central part and the central part is configured to bend along the at least two grooves around the opening to form a shape that fits a patient anatomy to be examined;
    a set of RF loop elements housed in the central part of the housing, wherein the set of RF loop elements comprises at least a central loop element and more than two other loop elements which are arranged to increase central image quality with the central loop element running around the opening and the more than two other loop elements arranged around and adjacent to the opening.

16. The receiving surface coil according to claim 15, wherein the patient's anatomy is any one of an elbow, a foot ankle, a knee joint or a breast.

17. The receiving surface coil according to claim 15, wherein the receiving surface coil comprises grooves in the at least two parts, wherein the grooves in the at least two parts form a grid pattern.

18. The receiving surface coil according to claim 15, wherein the receiving surface coil comprises grooves in the at least two parts, wherein the grooves in the at least two parts form a honeycomb structure.

19. The receiving surface coil according to claim 15, wherein the at least two grooves in the central part have indentations and the receiving surface coil is reversible.

* * * * *